(12) United States Patent
Gorin et al.

(10) Patent No.: US 10,145,877 B1
(45) Date of Patent: Dec. 4, 2018

(54) ADAPTIVE NOISE REDUCTION IN A SIGNAL ANALYZER

(71) Applicant: Keysight Technologies, Inc., Minneapolis, MN (US)

(72) Inventors: Joseph Michael Gorin, Santa Rosa, CA (US); John Francis McLaughlin, Santa Rosa, CA (US)

(73) Assignee: Keysight Technologies, Inc., Loveland, CO (US)

( * ) Notice: Subject to any disclaimer, the term of this patent is extended or adjusted under 35 U.S.C. 154(b) by 157 days.

(21) Appl. No.: 15/163,856

(22) Filed: May 25, 2016

(51) Int. Cl.
  *G01R 29/08* (2006.01)
  *G01R 23/173* (2006.01)
  *G01R 23/16* (2006.01)

(52) U.S. Cl.
  CPC ....... *G01R 29/0892* (2013.01); *G01R 23/173* (2013.01); *G01R 23/16* (2013.01)

(58) Field of Classification Search
  None
  See application file for complete search history.

(56) References Cited

U.S. PATENT DOCUMENTS

| | | | |
|---|---|---|---|
| 6,191,571 B1 * | 2/2001 | Fukui | G01R 23/16 324/614 |
| 7,266,358 B2 | 9/2007 | Hillstrom | |
| 9,140,730 B2 | 9/2015 | Otani et al. | |
| 2005/0261880 A1 | 11/2005 | Gorin | |
| 2007/0032983 A1 * | 2/2007 | Zeidan | G01R 29/26 702/179 |

OTHER PUBLICATIONS

Vlatko Ljfovac, Increasing Dynamic Range of Practical Microwave Spectrum Analysis by Reducing or Compensating System Noise, Sep. 20-23, 2003 IEEE, 1069-1073, IMOC 2003.
Dimitrios Stratakis, Noise Reduction for Accurate PowerMeasurement of Low Level Signals, Jul. 28-30, 2014 IEEE, 162-166.

* cited by examiner

*Primary Examiner* — John Kuan

(57) ABSTRACT

In an exemplary embodiment of the disclosure, a signal analyzer includes at least one noise reduction system in the form of an adaptive noise reduction system. The adaptive noise reduction system executes an adaptive noise floor extension (NFE) procedure that includes determining a predicted standard deviation of a response by the signal analyzer to intrinsic noise in the signal analyzer when various signal processing parameters desired by a user are applied to an input signal. The predicted standard deviation is then used in the signal analyzer to select and apply various noise subtraction values upon the input signal before displaying of a signal spectrum of the input signal upon a display of the signal analyzer. The adaptive NFE procedure is directed at reducing or eliminating various ambiguities and/or errors in the displayed signal spectrum.

20 Claims, 8 Drawing Sheets

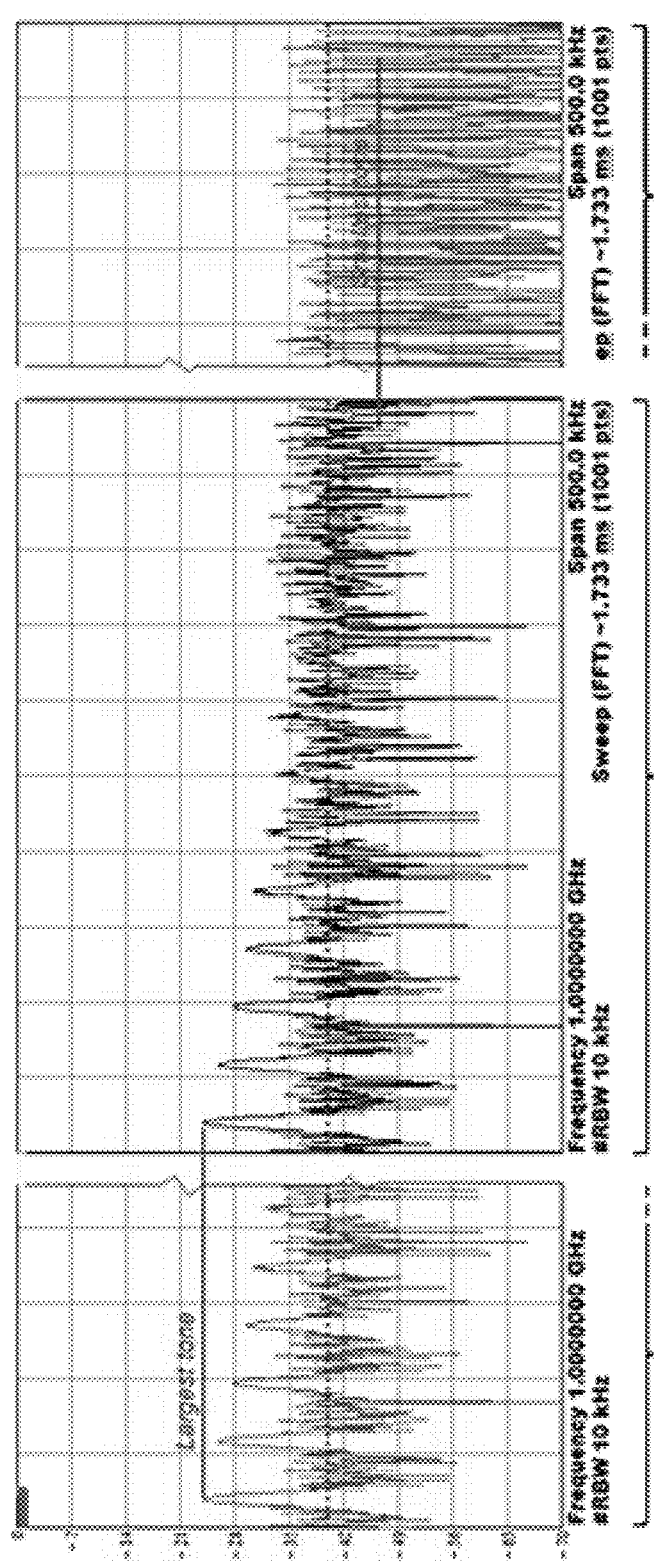

ADAPTIVE NOISE REDUCTION IN A SIGNAL ANALYZER

BACKGROUND

The dynamic range of a signal analyzer can be adversely impacted by noise that is intrinsic to the signal analyzer if this intrinsic noise is not taken into consideration when carrying out signal measurements. The intrinsic noise, which limits the lowest signal level detectable by the signal analyzer, can be characterized by what is known in the art as a noise floor. The noise floor can be measured by observing a spectral output on a display of the signal analyzer after terminating one or more ports of the signal analyzer by a characteristic impedance, such as 50 ohms. However, even when aware of the noise floor of the signal analyzer, a user may find it difficult or confusing to accurately determine a signal-to-noise ratio of an input signal, especially when the signal amplitude is in the vicinity of the noise floor.

Consequently, various types of noise reduction measures have been traditionally used to address this issue. Unfortunately, in some cases, the noise reduction measures can prove inadequate, while in some other cases, the noise reduction measures can actually result in a display that is either erroneous, misleading, or ambiguous. An uninformed user may draw improper conclusions based on such an erroneous, misleading, or ambiguous display.

SUMMARY

Certain embodiments of the disclosure can provide a technical effect and/or solution to execute an adaptive noise floor extension (NFE) procedure in a signal analyzer. The adaptive NFE procedure can be applied to an input signal based on various signal processing parameters desired by a user of the signal analyzer and on a predicted standard deviation of a response by the signal analyzer to intrinsic noise in the signal analyzer. In accordance with the disclosure, the resulting display of the signal upon a display screen of the signal analyzer can reduce or eliminate various ambiguities that can be present in some traditional signal analyzers wherein noise reduction procedures are applied for example, on the basis of average noise values or absolute noise values.

According to one exemplary embodiment of the disclosure, a signal analyzer can include an input port for coupling a signal into the signal analyzer; one or more controls operable to set one or more signal processing parameters for processing the signal; a memory containing a set of computer-executable instructions; and a processor configured to access the memory and execute the set of computer-executable instructions. The computer-executable instructions can be used to determine, based at least in part on the one or more signal processing parameters set via the one or more controls, a predicted standard deviation of a response by the signal analyzer to intrinsic noise in the signal analyzer; select from a set of noise subtraction values, at least a first noise subtraction value that is based on the predicted standard deviation; execute an adaptive noise floor extension (NFE) procedure upon the signal, the adaptive NFE procedure based at least in part on using the first noise subtraction value. The signal analyzer further includes a display for displaying the signal after execution of the adaptive NFE procedure.

According to another exemplary embodiment of the disclosure, a method can include various actions such as determining, based at least in part on one or more signal processing parameters set via one or more controls of a signal analyzer, a predicted standard deviation of a response by the signal analyzer to intrinsic noise in the signal analyzer; selecting from a set of noise subtraction values, at lesat a first noise subtraction value that is based on the predicted standard deviation; receiving a signal via an input port of the signal analyzer; executing an adaptive noise floor extension (NFE) procedure upon the signal, the adaptive NFE procedure based at least in part on using the first noise subtraction value; and displaying the signal after execution of the adaptive NFE procedure.

According to yet another exemplary embodiment of the disclosure, a signal analyzer can include a display; an input port; a resolution bandwidth (RBW) filter; a trace averaging subsystem; a user interface; and an adaptive noise floor extension (NFE) system. The user interface can include a first control for setting one or more operating parameters of the RBW filter and a second control for setting one or more operating parameters of the trace averaging subsystem. The adaptive NFE system is configured to determine, based at least in part on a setting of an operating parameter of the RBW filter and a setting of an operating parameter of the trace averaging subsystem, a predicted standard deviation of a response by the signal analyzer to intrinsic noise in the signal analyzer; select from a set of noise subtraction values, at least a first noise subtraction value that is based on the predicted standard deviation; execute an adaptive NFE procedure upon a signal coupled into the signal analyzer via the input port, the adaptive NFE procedure based at least in part on using the first noise subtraction value. The signal can be displayed on the display after execution of the adaptive NFE procedure.

Other embodiments and aspects of the disclosure will become apparent from the following description taken in conjunction with the following drawings.

BRIEF DESCRIPTION OF THE FIGURES

Many aspects of the invention can be better understood by referring to the following description in conjunction with the accompanying claims and figures. Like numerals indicate like structural elements and features in the various figures. For clarity, not every element may be labeled with numerals in every figure. The drawings are not necessarily drawn to scale; emphasis instead being placed upon illustrating the principles of the invention. The drawings should not be interpreted as limiting the scope of the invention to the example embodiments shown herein.

FIG. 7A shows an exemplary display of a signal spectrum with low averaging and no NFE applied.

FIG. 7B shows an exemplary display of the signal spectrum shown in FIG. 7A but with low averaging applied and after application of an adaptive NFE procedure in accordance with the disclosure.

FIG. 7C shows an exemplary display of the signal shown in FIG. 7A but with low averaging applied and after application of a fixed-mode NFE procedure in accordance with the disclosure.

DETAILED DESCRIPTION

Throughout this description, embodiments and variations are described for the purpose of illustrating uses and implementations of inventive concepts. The illustrative description should be understood as presenting examples of inventive concepts, rather than as limiting the scope of the concepts as disclosed herein. Towards this end, certain words and terms are used herein solely for convenience and such words and terms should be broadly understood as encompassing various objects and actions that are generally understood in various forms and equivalencies by persons of ordinary skill in the art. For example, the phrase "noise floor extension" (NFE) as used herein generally pertains to systems and procedures that can be used to carry out noise reduction when displaying a signal on a signal analyzer. As another example, words such as "ambiguity" or "ambiguous" that are used herein with respect to a signal spectrum display can generally indicate a signal spectrum display that contains a level of noise that is distractive to a viewer and raises confusion in terms of estimating a signal-to-noise ratio. As such, in several instances, words such as "ambi- guity" or "ambiguous" can be replaced by equivalent words such as "distractiveness" or "distractive." It should also be understood that the word "example" as used herein is intended to be non-exclusionary and non-limiting in nature. More particularly, the word "exemplary" as used herein indicates one among several examples and it should be understood that no special emphasis, exclusivity, or preference, is associated or implied by the use of this word.

Generally, in accordance with the various illustrative embodiments disclosed herein, a signal analyzer can include at least one noise reduction system in the form of an adaptive noise reduction system. The adaptive noise reduction system executes an adaptive noise floor extension (NFE) procedure that includes determining a predicted standard deviation of a response by the signal analyzer to intrinsic noise in the signal analyzer when various signal processing parameters desired by a user are applied to an input signal. The predicted standard deviation is then used in the signal analyzer to select and apply various noise subtraction values upon the input signal before displaying of a signal spectrum of the input signal upon a display of the signal analyzer. The adaptive NFE procedure is directed at reducing or eliminating various ambiguities and/or errors in the displayed signal spectrum.

Figure 1:
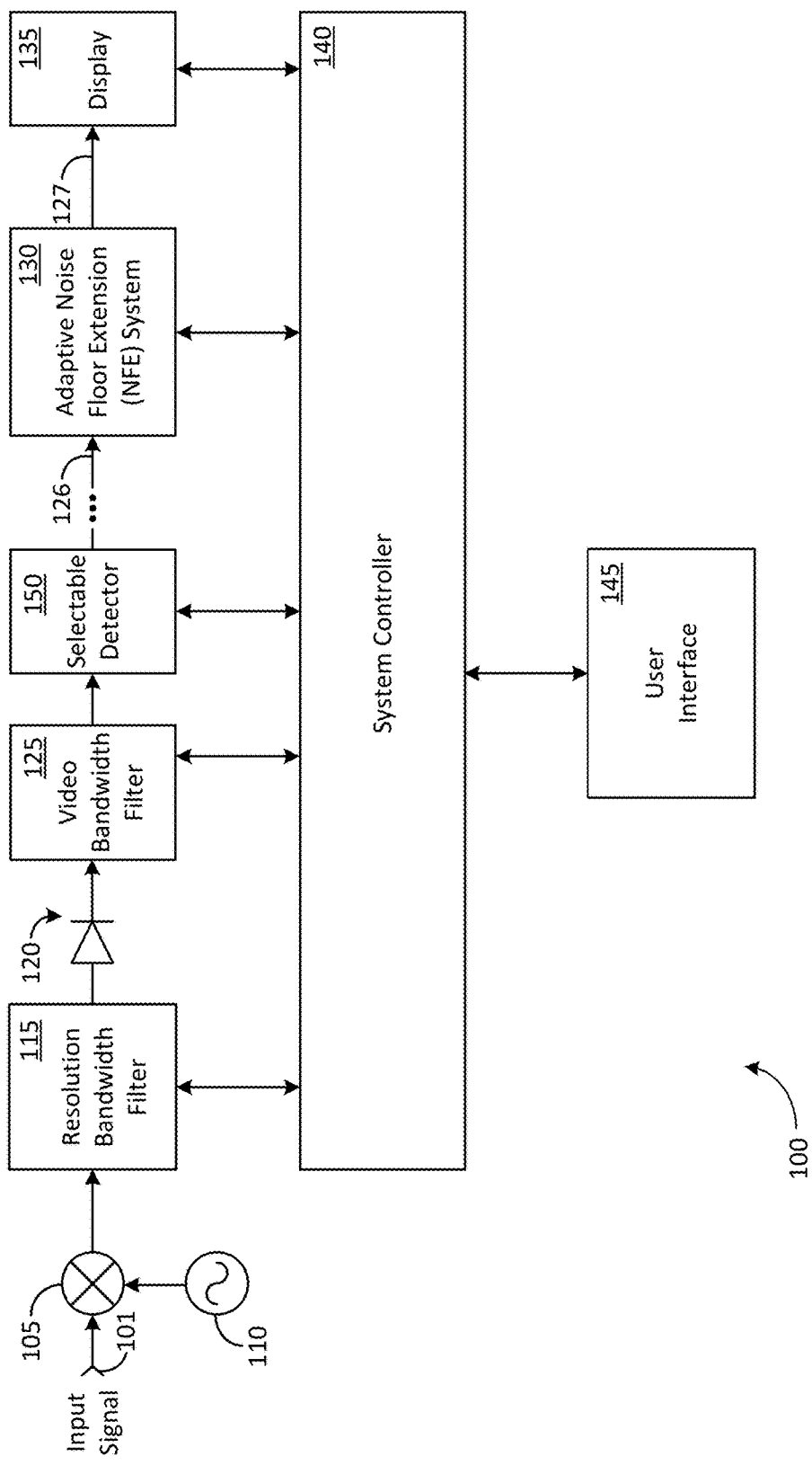
FIG. 1 shows an exemplary signal analyzer incorporating an adaptive noise floor extension (NFE) system in accordance with the disclosure.

Attention is now drawn to FIG. 1, which shows an exemplary signal analyzer 100 incorporating an adaptive NFE system 130 in accordance with the disclosure. The signal analyzer 100 can be used to view a spectrum of an input signal such as a radio-frequency (RF) input signal that is coupled into an input port 101 of the signal analyzer 100. The RF input signal is provided to a mixer 105 for executing frequency down-conversion by using a local oscillator 110 as is known in the art. The down-converted signal can be propagated through a resolution bandwidth filter 115, a diode detector 120, a video bandwidth filter 125, and a selectable detector 150, before being provided (via a connection link 126) to the adaptive NFE system 130. It must be understood that various other functions can be executed upon the input signal prior to processing in the adaptive NFE system 130, by using other functional blocks that are not shown in FIG. 1. Furthermore, the signal analyzer 100 includes various noise sources (not shown) that contribute to the noise floor of the signal analyzer 100. The noise floor can be determined for example, by observing a display 135 when the input port 101 is terminated by a characteristic impedance, such as 50 ohms. In this exemplary embodiment, the display 135 is coupled to the adaptive NFE system 130 via a connection link 127.

Also included in the signal analyzer 100, is a system controller 140 that can be communicatively coupled to the resolution bandwidth filter 115, the diode detector 120, the video bandwidth filter 125, the selectable detector 150, the adaptive NFE system 130, the display 135, and a user interface 145, for executing various functionalities of the signal analyzer 100. The user interface 145 can be implemented in various ways, such as by providing hardware control knobs or buttons on a front panel of the signal analyzer 100, and/or by providing a visual control interface (touch screen, soft keys etc.) on the display 135. A user (not shown) can use the user interface 145 to set various parameters such as a resolution bandwidth of the resolution bandwidth filter 115, a video bandwidth of the video bandwidth filter 125, a sweep time of the display 135, and/or a number of sampling points for sampling the signal. The user interface 145 can also be used by the user for selecting one of various types of signal detection. In this context, it should be understood that the selectable detector 150 is a symbolic representation of various types of detectors that can be selected in order to carry out one of various user-selectable types of signal detection associated with digitization. A few examples of user-selectable types of signal detection can include average power detection, peak signal detection, and logarithmic averaging detection, to name a few.

The resolution bandwidth filter 115 can be used to set a resolution bandwidth that determines the smallest resolvable frequency separation of a signal spectrum when displayed on the display 135. Typically, a wider resolution bandwidth results in a larger portion of the signal spectrum being displayed on the display 135 with a lower level of detail. For example, if the resolution bandwidth is set wider than the frequency separation between two signals, the signal spectrum displayed on the display 135 can misleadingly indicate a single signal rather than the two distinct signals. On the other hand, if the resolution bandwidth is set equal to the frequency separation between the two signals, the signal spectrum displayed on the display 135 may include two distinct signals with an ambiguous 3 dB dip between the two signals.

The video bandwidth filter 125 can be used to set a video bandwidth that determines how much smoothing is performed by the video bandwidth filter 125 upon the input signal for displaying on the display 135. Since the video bandwidth filter 125 is typically located after the resolution bandwidth filter 115 in the signal processing path, no smoothing takes place if the video bandwidth is set wider than or equal to the resolution bandwidth. Reducing the video bandwidth can lead to a reduction in the amount of variability in the signal spectrum displayed on the display 135. However, reducing the video bandwidth is generally accompanied by an increase in sweep time, which may not be desirable in certain cases.

The characteristics of the spectrum displayed on the display 135, particularly the noise floor, is determined by a combination of various operating parameters such as the type of signal detection, the resolution bandwidth, and the video bandwidth, that are set by a user upon the signal analyzer 100 based upon the user's preference for observing the input signal coupled into the input port 101. The adaptive NFE system 130 operates in conjunction with the various operating parameters set by the user, to provide a signal spectrum display that is not distractive to a user. These aspects will be described below in more detail using other figures.

Figure 2:
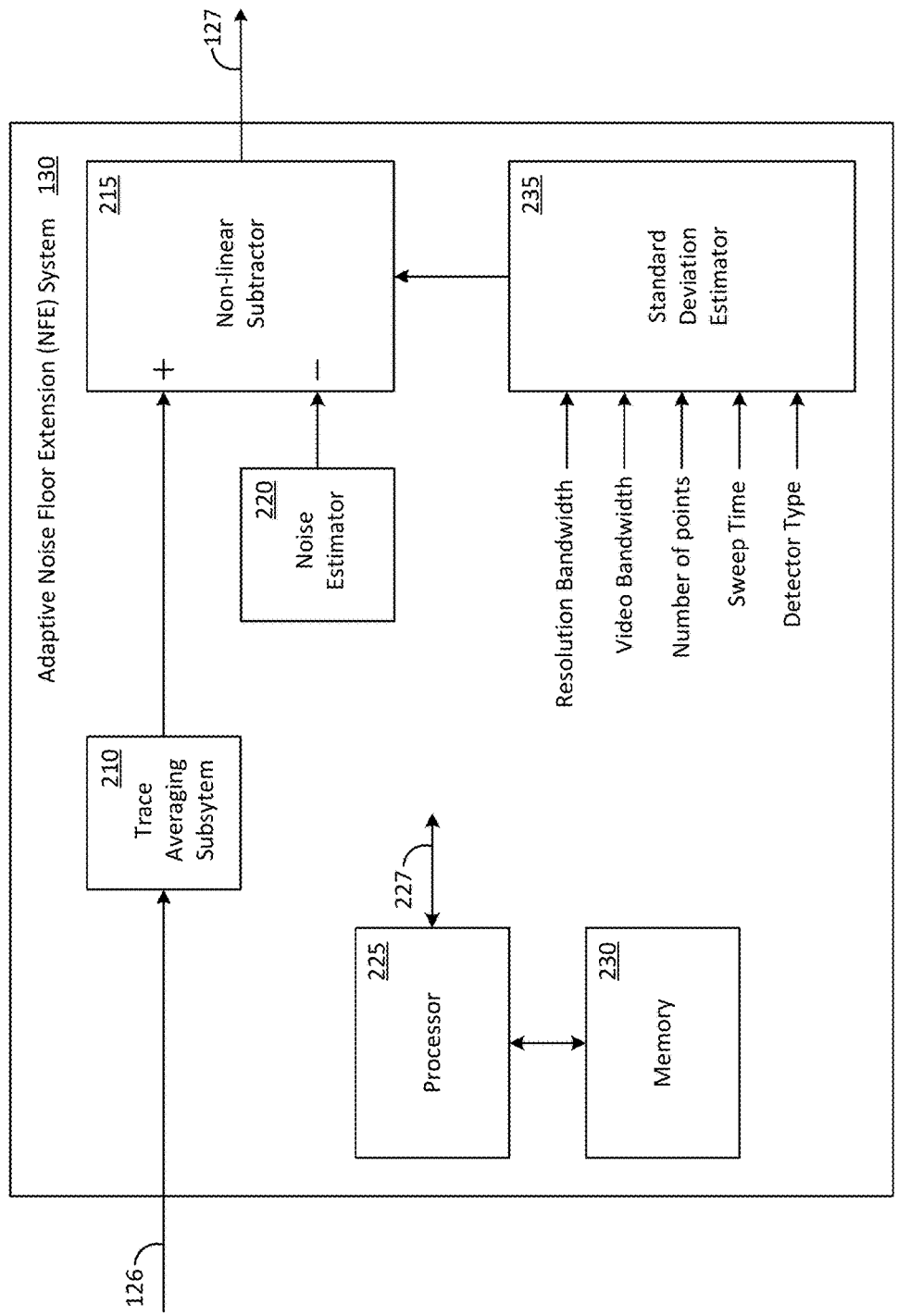
FIG. 2 illustrates a few exemplary elements of the adaptive NFE system that is incorporated into the signal analyzer shown in FIG. 1.

FIG. 2 illustrates a few exemplary elements of the adaptive NFE system 130 that is incorporated into the signal analyzer 100 shown in FIG. 1. The various exemplary elements can be provided in the form of hardware, software, firmware, or a combination thereof. When implemented in hardware, one or more of these various exemplary elements can be implemented together (e.g., in a logic device such as an integrated logic device) or separately (e.g., as separate connected logic devices). When implemented in a combination of hardware, software and/or firmware, the adaptive NFE system 130 can include a computer-readable storage medium in which is stored instructions that, when executed by a processor or computer system, execute all or parts of the functionalities associated with the respective elements. The computer-readable storage medium may comprise, for example, a random access memory (RAM) and/or a read-only memory (ROM). At least a portion of the instructions may be executed by a processor (e.g., a microprocessor, a microcontroller, a digital signal processor (DSP), or implemented as a hardware circuit in an application specific integrated circuit (ASIC), a standard logic integrated circuit, or a field programmable logic array (PLD, FPGA etc.)).

In the exemplary embodiment shown in FIG. 2, the adaptive NFE system 130 includes a processor 225 that is configured to execute a set of computer-executable instructions stored in a memory 230. The computer-executable instructions can be used for executing various operations, including configuring and operating the various elements that are a part of the adaptive NFE system 130. In one exemplary implementation, the processor 225 and/or the memory 230 can be integrated into the system controller 140 shown in FIG. 1, while in another example implementation, the processor 225 and the memory 230 can be used exclusively for carrying out various operations associated with the adaptive NFE system 130. These operations can be carried out via control signals and other types of signals that are communicated over a bidirectional communication link 227 to/from the various elements that are a part of the adaptive NFE system 130.

The trace averaging subsystem 210 can be used to set certain operating parameters of the signal analyzer 100, such as a sweep time for performing a measurement upon the input signal coupled into the input port 101. The trace averaging subsystem 210 can be coupled into a non-linear subtractor 215, which executes a subtraction operation upon the output of the trace averaging subsystem 210 with noise reduction data provided by a noise estimator 220.

The noise estimator 220, which can be dynamically configured and controlled by the processor 225, provides one or more noise subtraction values to the non-linear subtractor 215. In one exemplary implementation, the noise estimator 220 can include a look up table (LUT) containing various noise subtraction values that are derived in various ways, including, for example, from characteristic curves corresponding to variations in the noise floor versus the frequency to which the signal analyzer 100 is tuned. The LUT can be incorporated into the memory 230 in some embodiments and accessed by the processor 225 for configuring the non-linear subtractor 215, which can be implemented in hardware, software and/or firmware. When implemented in software and/or firmware, the non-linear subtractor 215 can be incorporated into the memory 230 in some embodiments.

In another exemplary embodiment, where the signal analyzer 100 incorporates a fixed-mode NFE system in lieu of, or in addition to, the adaptive NFE system 130, the noise estimator 220 can be configured and controlled by the processor 225 such that a fixed relationship between the positive and negative inputs of the non-linear subtractor 215 and the output of the non-linear subtractor 215 is established. In contrast, the adaptive NFE procedure provides a variable relationship between the positive and negative inputs of the non-linear subtractor 215 and the output of the non-linear subtractor 215.

The standard deviation estimator 235, which can be dynamically configured and controlled by the processor 225, generates signal processing information, including for example, a predicted standard deviation of a response by the signal analyzer to intrinsic noise in the signal analyzer 100. The standard deviation estimator 235 can generate the signal processing information by using various types of measurement parameters that are provided as inputs to the standard deviation estimator 235. A few examples of measurement parameters that can be provided to the standard deviation estimator 235 includes a resolution bandwidth, a video bandwidth, a sweep time, a detector type, and/or an amount of signal trace averaging that can be characterized by a number of points used for processing the input signal coupled into the input port 101 of the signal analyzer 100. Some or all of these measurement parameters can be set by a user of the signal analyzer 100 via the user interface 145, for example.

The predicted standard deviation of the response by the signal analyzer to intrinsic noise in the signal analyzer 100 can be determined by the standard deviation estimator 235 in various ways. For example, the predicted standard deviation can be based on one or more of a ratio between the video bandwidth and the resolution bandwidth values set by the user of the signal analyzer 100; on an amount of signal trace averaging set by the user of the signal analyzer 100; and/or a detector type selected by the user of the signal analyzer 100. For example, when the signal analyzer 100 executes trace averaging on a logarithmic scale, the response to noise is about 5.6 dB RMS, which is a known property of Gaussian noise. The bandwidth of the Gaussian noise can be set by the resolution bandwidth filter 115. The bandwidth of detected noise is approximately half that of the Gaussian noise. If the video bandwidth filter 125 is set 100 times smaller than a noise bandwidth of the detected envelope, for example, by setting the resolution bandwidth filter 115 to 1 kHz, thus achieving a detected noise bandwidth of 500 Hz, and setting the video bandwidth filter 125 to 5 Hz, the standard deviation should fall by a factor of the square root of the 500:5 ratio (i.e. by a factor of 10). Consequently, the predicted standard deviation will be 0.56 dB for measurements performed with these settings. In general terms, the standard deviation estimator 235 can be used to determine the predicted standard deviation based at least in part on the amount of variance reduction intrinsic to the signal analyzer 100. When the amount of variance reduction intrinsic to the signal analyzer 100 is low, a fixed-mode noise floor extension procedure may not necessarily provide a spectrum display on the display 135 having a noise floor that is unambiguously interpretable. Consequently, an adaptive NFE procedure in accordance with the disclosure can be applied in a relatively less impactful manner when the amount of variance reduction intrinsic to the signal analyzer 100 is low, and in a more impactful manner when the amount of variance reduction intrinsic to the signal analyzer 100 is higher. Such a selective application of a noise floor extension procedure in accordance with the disclosure can provide a signal spectrum display that has fewer ambiguities.

Figure 3:
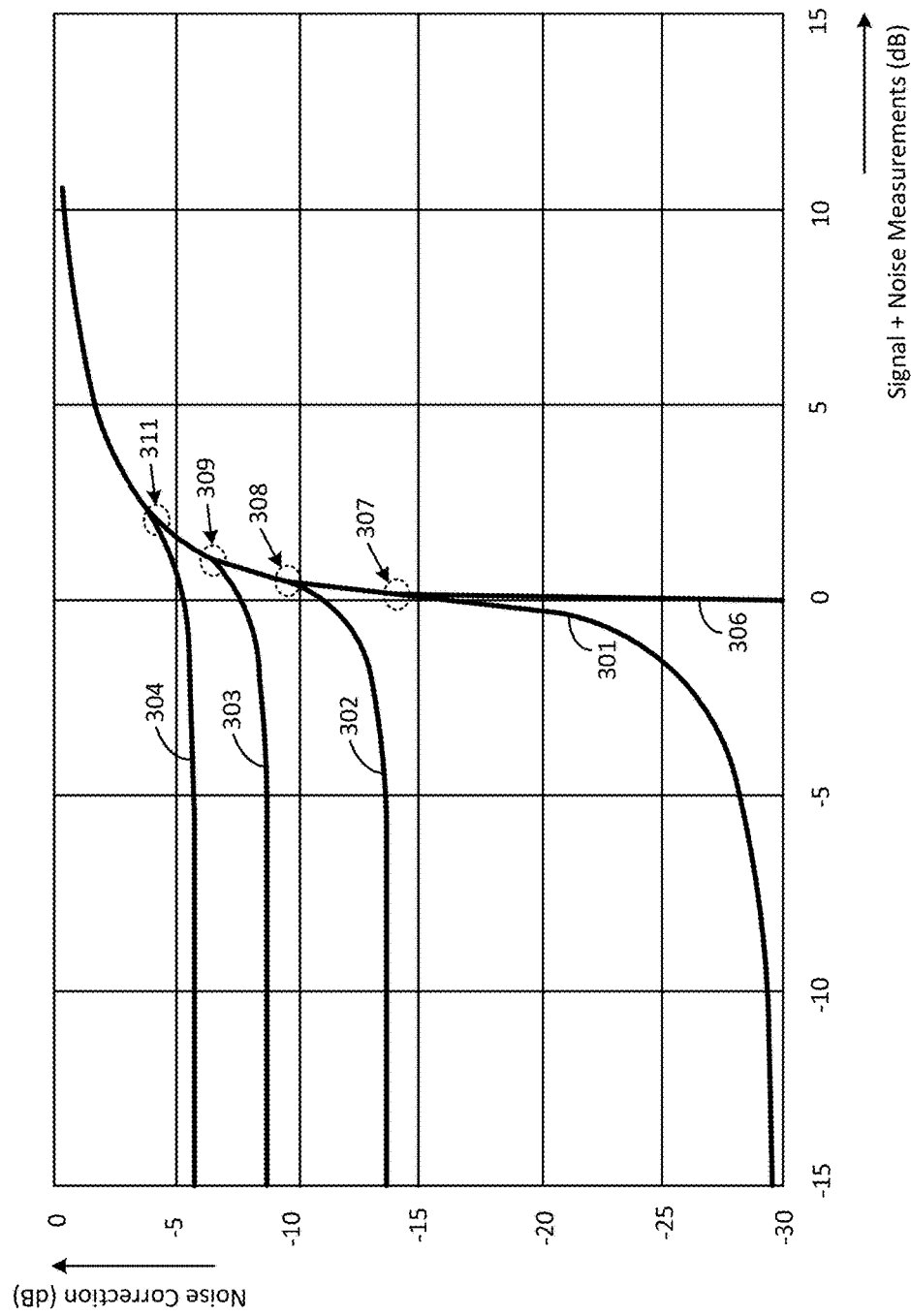
FIG. 3 shows a graph illustrating signal plus noise measurements versus noise correction for a few exemplary implementations of NFE procedures in accordance with the disclosure.

FIG. 3 shows several graphs of signal plus noise measurements versus noise correction for a few exemplary implementations of NFE procedures in accordance with the disclosure. These NFE procedures include an adaptive NFE procedure as well as a fixed-mode NFE procedure. The x-axis indicates signal plus noise measurements in the form of signal-plus-noise traces (in decibels) relative to a noise floor of the signal analyzer 100 and the y-axis indicates the changes in the signal spectrum display (in dBs) as a result of application of various levels of NFE. While the x-axis and y-axis parameters shown in FIG. 3 are based on a linear power scale (in dB), in other embodiments, the x-axis and y-axis parameters can be based on a logarithmic scale, a voltage scale, or one of several other scales.

In some implementations, the various characteristic curves shown in FIG. 3 can be used to determine noise subtraction values for configuring the noise estimator 220 shown in FIG. 2. Attention is now drawn to a characteristic curve 306 that represents a theoretical procedure for performing noise suppression with respect to a noise floor at 0 dB. It can be seen from the near-vertical portion of the characteristic curve 306 that no noise correction is carried out upon signals having an amplitude below 0 dB on the x-axis, which corresponds to a noise floor of the signal analyzer 100. However, in real life, signals provided to the signal analyzer 100 can have a magnitude that is lower than the noise floor of the signal analyzer 100 and the characteristic curve 306 does not provide a template for carrying out noise correction upon such low amplitude signals.

Consequently, one or more characteristic curves that extend below the 0 dB measured intrinsic noise level can be formulated for use in executing NFE procedures (adaptive and/or fixed-mode NFE) in accordance with the disclosure. It may be pertinent to point out that though it is not necessarily undesirable, it is preferable that these characteristic curves do not have a sharp discontinuity at a corner point where each of the characteristic curves diverges from the near-vertical portion of the theoretical characteristic curve 306. A few characteristic curves pertaining to several adaptive NFE procedures as well as a fixed-mode NFE procedure, in accordance with the disclosure will now be described in further detail. It may also be pertinent to point out that the various numerical values shown in FIG. 3 are used herein merely for purposes of description and can be different in various alternative implementations in accordance with the disclosure.

The characteristic curve 301, which can be used for executing a fixed-mode NFE procedure in accordance with the disclosure, substantially matches the theoretical characteristic curve 306 for signal plus noise measurements greater than about 0.144 dB (x-axis), which corresponds to a noise correction of about −14.87 dB (y-axis). However, at a corner point 307, the characteristic curve 301 deviates from the theoretical characteristic curve 306 and has a curved characteristic that extends downwards to provide a noise correction of about −29 dB (y-axis) at −15 dB (x-axis).

The manner by which the corner point 307 is chosen will now be described in further detail. The characteristic curve 301 can be viewed as representing a transfer function between signal plus noise measurements (x-axis values representing a combination of the noise floor of the signal analyzer 100 and the input signal coupled into the input port 101) and the noise correction provided by the signal analyzer 100 (y-axis values). Let it be assumed that the input signal is a noise-only signal having an envelope probability density function that is Gaussian, is centered at 0 dB, and has a standard deviation of 1 dB. Thus, the envelope of the noise-only signal will be in the range of ±2 dB for 95% of the time. In other words, the envelope of the noise-only signal will be above +2 dB for 2.5% of the time and below −2 dB for 2.5% of the time. When at +2 dB (x-axis value), the corresponding noise correction provided by the signal analyzer 100 (y-axis value) is about −7 dB, and when at −2 dB, the corresponding noise correction provided by the signal analyzer 100 (y-axis value) is about −24 dB. As indicated above, the characteristic curve 301 represents a fixed-mode NFE procedure, and the steep slope of the characteristic curve 301 between the +2 dB x-axis value and the −2 dB x-axis value can feasibly result in a signal spectrum display that is confusing or ambiguous to a user of the signal analyzer 100. However, the fixed-mode NFE procedure can still provide certain benefits in terms of the signal spectrum display for signal amplitudes that lie outside the ±2 dB portion of the envelope probability density function, particularly the portion that matches the theoretical characteristic curve 306.

Attention is next drawn to a characteristic curve 302, which can be used for executing an adaptive NFE procedure in accordance with a first exemplary implementation of the disclosure. The characteristic curve 302 substantially matches the characteristic curve 306 for signal plus noise measurements greater than about 0.5 dB (x-axis), which corresponds to a corner point 308. At the corner point 308, the characteristic curve 302 deviates from the theoretical characteristic curve 306 and has a curved characteristic that includes an initial downwards trending portion followed by a substantially flat portion. The substantially flat portion corresponds to a noise correction of about −13.6 dB (y-axis) over a signal plus noise measurement range (x-axis) that extends from about −5 dB to at least −15 dB.

Attention is next drawn to a characteristic curve 303, which can be used for executing an adaptive NFE procedure in accordance with a second exemplary implementation of the disclosure. The characteristic curve 303 substantially matches the theoretical characteristic curve 306 for signal plus noise measurements greater than about 1.0 dB (x-axis). However, at a corner point 309, the characteristic curve 303 deviates from the theoretical characteristic curve 306 and has a curved characteristic that includes an initial downwards trending portion followed by a substantially flat portion. The substantially flat portion corresponds to a noise correction of about −8.6 dB (y-axis) over a signal plus noise measurement range (x-axis) that extends from about −4 dB to at least −15 dB.

Attention is next drawn to a characteristic curve 304, which can be used for executing an adaptive NFE procedure in accordance with a third exemplary implementation of the disclosure. The characteristic curve 304 substantially matches the theoretical characteristic curve 306 for signal plus noise measurements greater than about 2 dB (x-axis). However, at a corner point 311, the characteristic curve 304 deviates from the theoretical characteristic curve 306 and has a curved characteristic that includes an initial downwards trending portion followed by a substantially flat portion. The substantially flat portion corresponds to a noise correction of about −5.8 dB (y-axis) over a signal plus noise measurement range (x-axis) that extends from about −3 dB to at least −15 dB.

It may be pertinent to point out that in various implementations, one or more of the corner point 307, the corner point 308, corner point 309, and the corner point 311, can be selected on the basis of a standard deviation. For example, a corner point may be determined by using a "k" times standard deviation formula.

Figure 4A:
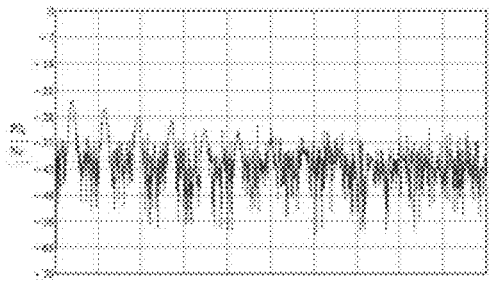
FIG. 4A shows an exemplary display of a signal spectrum with no averaging and no NFE applied.
Figure 4B:
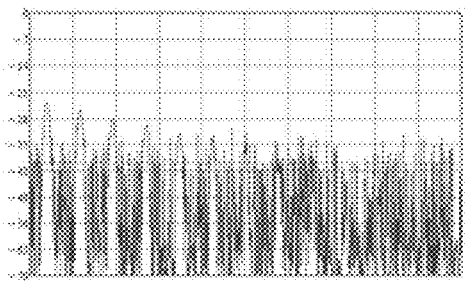
FIG. 4B shows an exemplary display of a signal spectrum with no averaging applied and after application of a fixed-mode NFE procedure in accordance with the disclosure.

FIG. 4A shows an exemplary display of a signal spectrum with no averaging applied and no NFE applied. In contrast, FIG. 4B shows an exemplary display of a signal spectrum with no averaging and after application of a fixed-mode NFE procedure in accordance with the invention. It can be observed that application of the fixed-mode NFE procedure leads to a spectrum display that can be distracting.

Figure 5A:
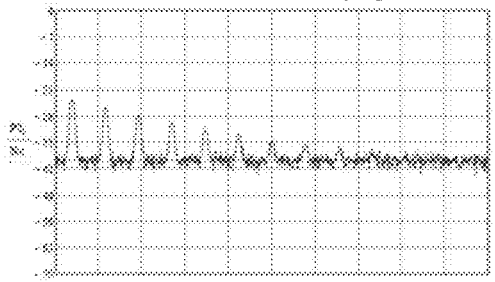
FIG. 5A shows an exemplary display of a signal spectrum with medium averaging and no NFE applied.
Figure 5B:
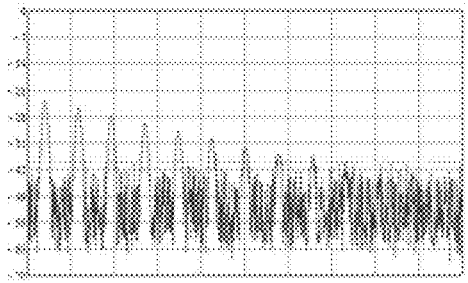
FIG. 5B shows an exemplary display of a signal spectrum with medium averaging applied and after application of a fixed-mode NFE procedure in accordance with the disclosure.

FIG. 5A shows an exemplary display of a signal spectrum with medium averaging applied and no NFE applied. In contrast, FIG. 5B shows an exemplary display of a signal spectrum with medium averaging and after application of a fixed-mode NFE procedure in accordance with the disclosure. In this case, the standard deviation of the trace is moderate without averaging, and some apparent improvement in the measurement of signals near the noise floor occurs, but there is still a large multiplication in the standard deviation of the trace through the NFE process.

Figure 6A:
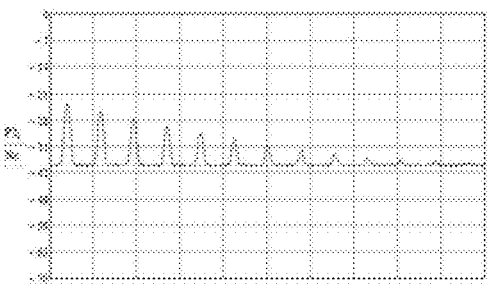
FIG. 6A shows an exemplary display of a signal spectrum but with high averaging and no NFE applied.
Figure 6B:
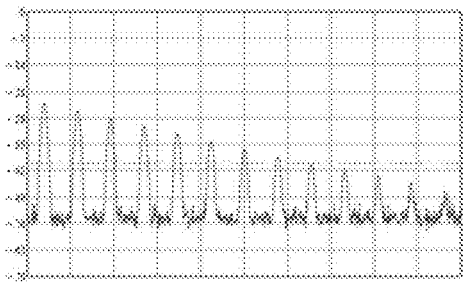
FIG. 6B shows an exemplary display of a signal spectrum with high averaging applied and after application of a fixed-mode NFE procedure in accordance with the disclosure.

FIG. 6A shows an exemplary display of a signal spectrum with high averaging applied and no NFE applied. In contrast, FIG. 6B shows an exemplary display of a signal spectrum with high averaging and after application of a fixed-mode NFE procedure in accordance with the disclosure. In this case, a high degree of improvement is possible because the standard deviation is very small before the application of NFE, such that even after multiplication by the NFE, the standard deviation does not become excessive.

In general, it can be understood with reference to FIGS. 4A, 4B, 5A, 5B, 6A and 6C, that when the amount of variance reduction intrinsic to the signal analyzer 100 is low, a fixed-mode NFE procedure does not effectively reduce an apparent amount of noise displayed on the display 135. However, the fixed-mode NFE procedure does provide an improvement in the signal spectrum display when the amount of variance reduction intrinsic to the signal analyzer 100 is relatively higher. The fixed-NFE procedure can thus be advantageously used in certain applications in accordance with the disclosure. Such advantages obtained by using a fixed-mode NFE procedure can be further enhanced by the use of an adaptive NFE procedure in which noise floor extension is applied in a relatively less impactful manner when the amount of variance reduction intrinsic to the signal analyzer 100 is low and in a more impactful manner when the amount of variance reduction intrinsic to the signal analyzer 100 is higher. Such a selective application of a noise floor extension procedure in accordance with the disclosure can provide a signal spectrum display that has fewer ambiguities. These aspects will now be described in further detail.

FIG. 7A shows an exemplary display of a signal spectrum with low averaging and no NFE applied. FIG. 7B shows an exemplary display of the signal spectrum shown in FIG. 7A but with low averaging applied and after application of an adaptive NFE procedure in accordance with the disclosure. FIG. 7C shows an exemplary display of the signal shown in FIG. 7A but with low averaging applied and after application of a fixed-mode NFE procedure in accordance with the disclosure. It can be understood from FIGS. 7A and 7B that the adaptive NFE procedure provides a signal spectrum display that is somewhat similar to the signal spectrum display with no application of NFE when low averaging is applied to an input signal. It can be further understood from FIGS. 7B and 7C that the adaptive NFE procedure provides a signal spectrum display that is somewhat better than the signal spectrum display obtained by using a fixed-mode NFE procedure.

Figures 8A, 8B, 8C:
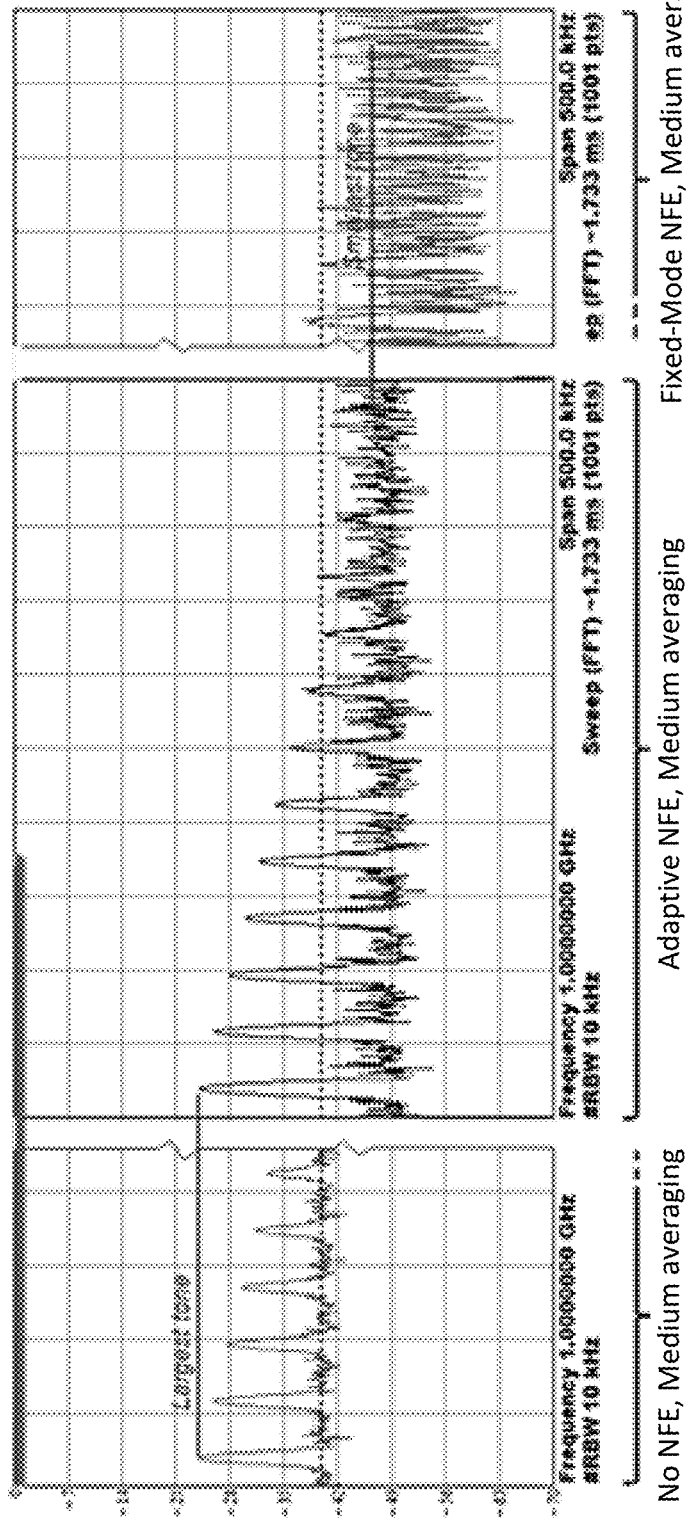
FIG. 8A shows an exemplary display of a signal spectrum with medium averaging and no NFE applied.
FIG. 8B shows an exemplary display of the signal spectrum shown in FIG. 8A but with medium averaging applied and after application of an adaptive NFE procedure in accordance with the disclosure.
FIG. 8C shows an exemplary display of the signal shown in FIG. 8A but with medium averaging applied and after application of a fixed-mode NFE procedure in accordance with the disclosure.

FIG. 8A shows an exemplary display of a signal spectrum with medium averaging and no NFE applied. FIG. 8B shows an exemplary display of the signal spectrum shown in FIG. 8A but with medium averaging applied and after application of an adaptive NFE procedure in accordance with the disclosure. FIG. 8C shows an exemplary display of the signal shown in FIG. 8A but with medium averaging applied and after application of a fixed-mode NFE procedure in accordance with the disclosure. It can be understood from FIGS. 8A and 8B that the adaptive NFE procedure provides a signal spectrum display that has a lower noise floor than the signal spectrum display with no application of NFE when medium averaging is applied to an input signal. The lower noise floor allows a user of the signal analyzer 100 to interpret the signal spectrum display with relatively less ambiguity than the signal spectrum display shown in FIG. 8A. It can be further understood from FIGS. 8B and 8C that the adaptive NFE procedure provides a signal spectrum display that is somewhat less ambiguous than the signal spectrum display obtained by using a fixed-mode NFE procedure.

Figures 9A, 9B, 9C:
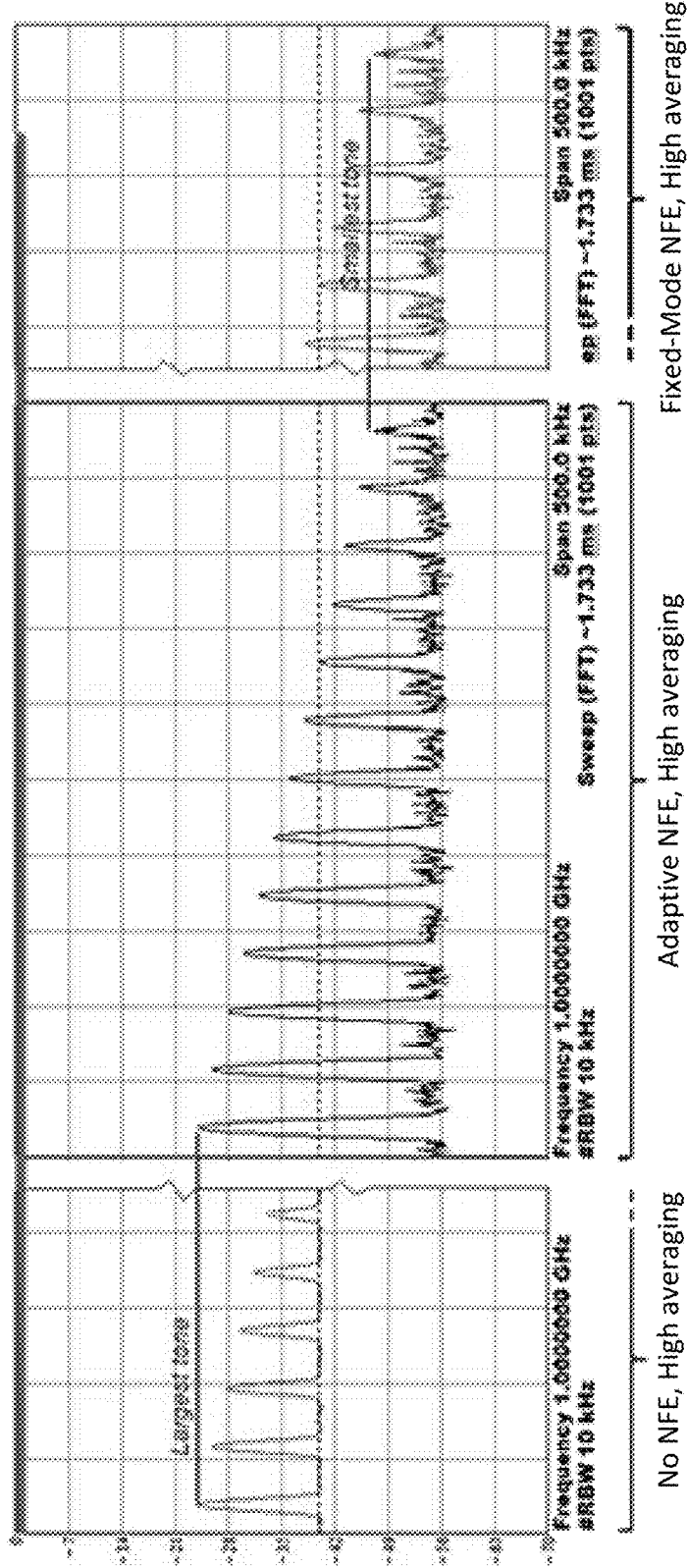
FIG. 9A shows an exemplary display of a signal spectrum with high averaging and no NFE applied.
FIG. 9B shows an exemplary display of the signal spectrum shown in FIG. 9A but with high averaging applied and after application of an adaptive NFE procedure in accordance with the disclosure.
FIG. 9C shows an exemplary display of the signal spectrum shown in FIG. 9A but with high averaging applied and after application of a fixed-mode NFE procedure in accordance with the disclosure.

FIG. 9A shows an exemplary display of a signal spectrum with high averaging and no NFE applied. FIG. 9B shows an exemplary display of the signal spectrum shown in FIG. 9A but with high averaging applied and after application of an adaptive NFE procedure in accordance with the disclosure. FIG. 9C shows an exemplary display of the signal shown in FIG. 9A but with high averaging applied and after application of a fixed-mode NFE procedure in accordance with the disclosure. It can be understood from FIGS. 9A and 9B that the adaptive NFE procedure provides a signal spectrum display that has a lower noise floor than the signal spectrum display with no application of NFE when high averaging is applied to an input signal. The lower noise floor allows a user of the signal analyzer 100 to interpret the signal spectrum display with relatively less ambiguity than the signal spectrum display shown in FIG. 9A. It can be further understood from FIGS. 9B and 9C that the adaptive NFE procedure provides a signal spectrum display that is somewhat similar to the signal spectrum display obtained by using a fixed-mode NFE procedure.

Figure 10:
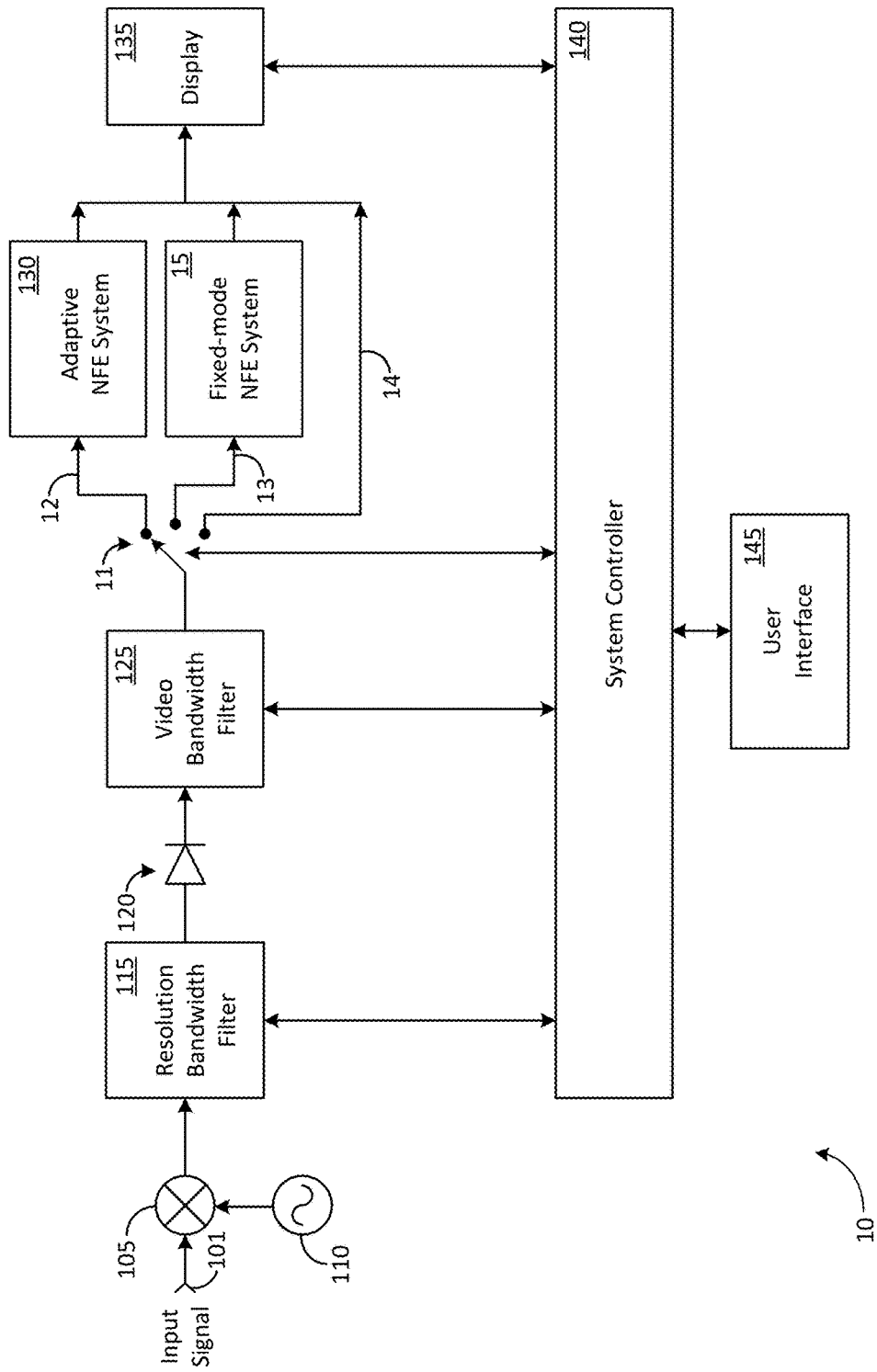
FIG. 10 shows an exemplary signal analyzer incorporating a selector switch that can be used to select one an adaptive NFE system, a fixed-mode NFE system, or no NFE, in accordance with the disclosure.

FIG. 10 shows an exemplary signal analyzer 10 incorporating a selector switch 11 that can be used to select one an adaptive NFE system 130, a fixed-mode NFE system 15, or no NFE, in accordance with the disclosure. The selector switch 11 can be a solid-state switch, for example. Several elements of the exemplary signal analyzer 10, such as the resolution bandwidth filter 115 and the video bandwidth filter 125 are similar to, or identical, in functionality to corresponding elements of the exemplary signal analyzer 100 shown in FIG. 1, and as such are designated by the same reference numerals. In this exemplary embodiment, the selector switch 11 is settable by a user via the user interface 145 and the system controller 140, thereby allowing the user to select application of one of the adaptive NFE system 130, the fixed-mode NFE system 15, or no NFE, upon an input signal coupled into the input port 101. The system controller 140 executes the user selection by transmitting a control signal to the selector switch 11. The selector switch accordingly routes the input signal received from the video bandwidth filter 125, via one of a first path 12 to the adaptive NFE system 130, a second path 13 to the fixed-mode NFE system 15, or a third path 14 that bypasses the adaptive NFE system 130 as well as the fixed-mode NFE system 15.

In summary, it should be noted that the invention has been described with reference to a few illustrative embodiments for the purpose of demonstrating the principles and concepts of the invention. It will be understood by persons of skill in the art, in view of the description provided herein, that the invention is not limited to these illustrative embodiments. Persons of skill in the art will understand that many such variations can be made to the illustrative embodiments without deviating from the scope of the invention.

What is claimed is:

1. A signal analyzer comprising:
an input port for coupling a signal into the signal analyzer;
one or more controls operable to set one or more signal processing parameters for processing the signal;
a non-transitory memory containing a set of computer-executable instructions;
a processor configured to access the memory and execute the set of computer-executable instructions to at least:
determine, based at least in part on the one or more signal processing parameters set via the one or more controls, a predicted standard deviation of a response by the signal analyzer to intrinsic noise in the signal analyzer;
select from a set of noise subtraction values, at least a first noise subtraction value that is based on the predicted standard deviation;
execute an adaptive noise floor extension (NFE) procedure upon the signal to provide a signal having reduced noise, the adaptive NFE procedure based at least in part on the first noise subtraction value; and
a display for displaying a spectrum of the reduced noise signal after execution of the adaptive NFE procedure.

2. The signal analyzer of claim 1, further comprising one or more selectors for selecting one of the adaptive NFE procedure or a fixed-mode NFE procedure, the fixed-mode NFE procedure comprising use of a fixed noise subtraction relationship in a non-linear subtractor.

3. The signal analyzer of claim 2, wherein the fixed-mode NFE procedure is directed at providing a fixed amount of noise subtraction irrespective of visual interpretation ambiguities associated with the signal displayed on the display.

4. The signal analyzer of claim 1, wherein the one or more signal processing parameters set via the one or more controls of the signal analyzer comprises one or more of a resolution bandwidth, a video bandwidth, a sweep time, a detector type, and an amount of signal trace averaging.

5. The signal analyzer of claim 4, wherein the adaptive NFE procedure is further based on use of one of a power scale, a logarithmic scale, or a voltage scale.

6. A method comprising:
determining, based at least in part on one or more signal processing parameters set via one or more controls of a signal analyzer, a predicted standard deviation of a response by the signal analyzer to intrinsic noise in the signal analyzer;
selecting from a set of noise subtraction values, at least a first noise subtraction value that is based on the predicted standard deviation;
receiving a signal via an input port of the signal analyzer;
executing an adaptive noise floor extension (NFE) procedure upon the signal, the adaptive NFE procedure based at least in part on the selected first noise subtraction value to provide a signal having reduced noise;
selecting one of the adaptive NFE procedure or a fixed-mode NFE procedure to be executed upon the signal, the fixed-mode NFE procedure comprising use of a fixed noise subtraction relationship in a non-linear subtractor, to provide a signal having reduced noise; and
displaying a spectrum of at least one of the reduced noise signals.

7. The method of claim 6, wherein the one or more signal processing parameters set via the one or more controls of the signal analyzer comprises one or more of a resolution bandwidth, a video bandwidth, a sweep time, a detector type, and an amount of signal trace averaging.

8. The method of claim 7, wherein selecting from the set of noise subtraction values comprises selecting an amount of improvement in decibels when executing the adaptive NFE procedure.

9. The method of claim 6, wherein determining the predicted standard deviation is based on at least one of: a) a ratio between a video bandwidth setting and a resolution bandwidth setting on the signal analyzer, b) a trace average setting on the signal analyzer, and c) a detector type setting on the signal analyzer.

10. A signal analyzer comprising:
a display;
an input port;
a resolution bandwidth (RBW) filter;
a trace averaging subsystem;
a user interface comprising a first control for setting one or more operating parameters of the RBW filter and a second control for setting one or more operating parameters of the trace averaging subsystem; and an adaptive noise floor extension (NFE) system configured to:
- determine, based at least in part on a setting of an operating parameter of the RBW filter and a setting of an operating parameter of the trace averaging subsystem, a predicted standard deviation of a response by the signal analyzer to intrinsic noise in the signal analyzer;
- select from a set of noise subtraction values, at least a first noise subtraction value that is based on the predicted standard deviation;
- execute an adaptive noise floor extension (NFE) procedure upon an input signal coupled into the signal analyzer via the input port to provide a signal having reduced noise, the adaptive NFE procedure based at least in part on using the first noise subtraction value; and
- display a spectrum of the reduced noise signal on the display after execution of the adaptive NFE procedure.

11. The signal analyzer of claim 10, wherein the operating parameter of the RBW filter is a resolution bandwidth and the operating parameter of the trace averaging subsystem is a sweep time.

12. The signal analyzer of claim 10, further comprising a video bandwidth (VBW) filter and wherein determining the predicted standard deviation is based at least in part on the setting of the operating parameter of the RBW filter, the setting of the operating parameter of the trace averaging subsystem, and a setting of an operating parameter of the VBW filter.

13. The signal analyzer of claim 12, wherein the operating parameter of the VBW filter is a video bandwidth.

14. The signal analyzer of claim 13, further comprising one or more detectors and wherein determining the predicted standard deviation is based on at least one of: a) a ratio between the video bandwidth setting of the VBW filter and a resolution bandwidth setting of the RBW filter, and b) a characteristic of a selected one of the one or more detectors.

15. The signal analyzer of claim 12, further comprising one or more detectors, wherein determining the predicted standard deviation is based at least in part on the setting of the operating parameter of the RBW filter, the setting of the operating parameter of the trace averaging subsystem, the setting of the operating parameter of the VBW filter, and a characteristic of a selected one of the one or more detectors.

16. The signal analyzer of claim 10, further comprising one or more selectors for selecting one of the adaptive NFE procedure or a fixed-mode NFE procedure to be executed upon the input signal, the fixed-mode NFE procedure characterized at least in part by use of a fixed noise subtraction relationship in a non-linear subtractor.

17. The signal analyzer of claim 16, wherein the fixed-mode NFE procedure is directed at providing a fixed amount of noise subtraction.

18. The signal analyzer of claim 16, wherein the fixed-mode NFE procedure is directed at providing a fixed amount of noise subtraction irrespective of visual interpretation ambiguities associated with the signal displayed on the display.

19. The signal analyzer of claim 16, wherein the one or more selectors are settable by a user via the user interface.

20. The signal analyzer of claim 10, wherein the adaptive NFE procedure is further based on use of one of a power scale, a logarithmic scale, or a voltage scale.

* * * * *